United States Patent
Sharma et al.

(10) Patent No.: US 6,785,160 B1
(45) Date of Patent: Aug. 31, 2004

(54) METHOD OF PROVIDING STABILITY OF A MAGNETIC MEMORY CELL

(75) Inventors: Manish Sharma, Mountain View, CA (US); Manoj K. Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/425,352

(22) Filed: Apr. 29, 2003

(51) Int. Cl.⁷ .............................................. G11C 11/00
(52) U.S. Cl. ...................... 365/158; 365/171; 365/173
(58) Field of Search ................................ 365/158, 171, 365/173

(56) References Cited

U.S. PATENT DOCUMENTS

| | | | |
|---|---|---|---|
| 5,734,606 A | * | 3/1998 | Tehrani et al. .............. 365/173 |
| 6,028,786 A | * | 2/2000 | Nishimura .................. 365/173 |
| 6,404,674 B1 | | 6/2002 | Anthony et al. |
| 6,430,084 B1 | * | 8/2002 | Rizzo et al. ................ 365/173 |
| 6,643,168 B2 | * | 11/2003 | Okazawa .................... 365/173 |
| 6,665,205 B2 | * | 12/2003 | Lee et al. ..................... 365/66 |

* cited by examiner

*Primary Examiner*—Son Mai
(74) *Attorney, Agent, or Firm*—Brian R. Short

(57) ABSTRACT

The invention includes a method of providing magnetic stability of a memory cell. The memory cell is generally located proximate to a conductive line, and proximate to a write mechanism that can set a magnetic state of the memory cell. The method includes receiving a representation of a maximum magnetic field intensity available from the write mechanism. A desirable placement of the memory cell relative to the conductive line can be generated for providing stability of the memory cell, while still allowing the write mechanism to change the magnetic state of the memory cell.

20 Claims, 10 Drawing Sheets

METHOD OF PROVIDING STABILITY OF A MAGNETIC MEMORY CELL

FIELD OF THE INVENTION

The invention relates generally to electronic memory. More particularly, the invention relates to a method of providing stability of a magnetic memory cell.

BACKGROUND OF THE INVENTION

Non-volatile memory is memory that retains its content (data) even when power connected to the memory is turned off. Magnetic random access memory (M RAM) is a type of non-volatile memory. MRAM includes storing a logical state, or bit, by setting magnetic field orientations of MRAM cells within the MRAM. The magnetic field orientations remain even when power to the MRAM cells is turned off.

FIG. 1 shows an MRAM cell 100. The MRAM memory cell 100 includes a soft magnetic region 120, a dielectric region 130 and a hard magnetic region 110. The orientation of magnetization within the soft magnetic region 120 is non-fixed, and can assume two stable orientations as shown by the arrow M1. The hard magnetic region 110 (also referred to as a pinned magnetic region) has a fixed magnetic orientation as depicted by the arrow M2. The dielectric region 130 generally provides electrical insulation between the soft magnetic region 120 and the hard magnetic region 110.

The MRAM memory cell generally is located proximate to a crossing point of a word line (WL) and a bit line (BL). The word line and the bit line can be used for setting the magnetic state of the memory cell, or for sensing an existing magnetic state of the memory cell. FIG. 1 also includes a proximate word line that can also be used to set the magnetic state of the MRAM memory cell 100. A magnetic field as depicted by the arrow 150 can be induced by a current I flowing through the proximate word line. The induced magnetic field can set the magnetic state of the MRAM memory cell 100.

As previously stated, the orientation of magnetization of the soft magnetic region 120 can assume two stable orientations. These two orientations, which are either parallel or anti-parallel to the magnetic orientation of the hard magnetic region 110, determine the logical state of the MRAM memory cell 100.

The magnetic orientations of the MRAM memory cells can be set (written to) by controlling electrical currents flowing through the word lines and the bit lines, and therefore, by the corresponding magnetic fields induced by the electrical currents. Because the word line and the bit line operate in combination to switch the orientation of magnetization of the selected memory cell (that is, to write to the memory cell), the word line and the bit line can be collectively referred to as write lines. Additionally, the write lines can also be used to read the logic value stored in the memory cells. The electrical currents applied to the bit line and the word line set the orientation of the magnetization of the soft magnetic layer depending upon the directions of the currents flowing through the bit line and the word line, and therefore, the directions of the induced magnetic fields created by the currents flowing through the bit line and the word line.

The MRAM memory cells are read by sensing a resistance across the MRAM memory cells. The resistance is sensed through the word lines and the bit lines. Generally, the logical state (for example, a "0" or a "1") of a magnetic memory cell depends on the relative orientations of magnetization in the data layer and the reference layer. For example, in a tunneling magneto-resistance memory cell (a tunnel junction memory cell), when an electrical potential bias is applied across the data layer and the reference layer, electrons migrate between the data layer and the reference layer through the intermediate layer (a thin dielectric layer typically called the tunnel barrier layer). The phenomenon that causes the migration of electrons through the barrier layer may be referred to as quantum mechanical tunneling or spin tunneling. The logic state can be determined by measuring the resistance of the memory cell. For example, the magnetic memory cell is in a state of low resistance if the overall orientation of the magnetization in its data storage layer is parallel to the pinned orientation of magnetization of the reference layer. Conversely, the tunneling junction memory cell is in a high resistance if the overall orientation of magnetization in its data storage layer is anti-parallel to the pinned orientation of magnetization of the reference layer. As mentioned, the logic state of a bit stored in a magnetic memory cell is written by applying external magnetic fields that alter the overall orientation of magnetization of the data layer. The external magnetic fields may be referred to as switching fields that switch the magnetic memory cells between high and low resistance states.

Magnetic stability of the data layer is important. That is, once the state of the data layer has been set by the externally applied magnetic fields, it is desirable that the magnetic state of the data layer remain the same until the external magnetic fields are once again applied.

Various factors can influence the stability of an MRAM memory cell. For example, certain shapes of memory cells are more stable than other shapes. Additionally, conductive line proximate to the memory cells can influence the stability of the memory cells.

While it is important to maintain MRAM memory cell stability, it is also important that the write lines and bit lines be able to change the logical state of the MRAM memory cell. That is, the stability must not be so great that externally applied write fields can not successfully write to the MRAM memory cell.

FIG. 2 shows an array 210 of MRAM memory cells. The logical states of each of the MRAM memory cells can be magnetically set by externally applied magnetic fields through bit lines (BL) and word lines (WL). Generally, the bit line and word line selections are made through a row decoder 220 and a column decoder 230. The logical states of the memory cells are determined by a sense amplifier 240.

It is desirable that the stability of each of the MRAM memory cells be approximately the same. That is, it is desirable that the magnetic field intensity required to write to each of the memory cells (more precisely, the magnetic field required to change the magnetic state of the memory cells) be consistent from one memory cell to another memory cell.

It is desirable to have a method and apparatus for providing desirable memory cell location with respect to conductive lines, and for providing desirable memory cell shapes, to ensure memory cell stability. It is additionally desirable that the method and apparatus provide the memory cell locations and memory cell shapes such that magnetic write fields of the memory cell can consistently change the logical state of the memory cell.

SUMMARY OF THE INVENTION

The invention includes a method and apparatus for providing desirable memory cell location with respect to conductive lines, and for providing desirable memory cell shapes, to ensure memory cell stability. The method and apparatus provides the memory cell locations and memory cell shapes such that magnetic write fields of the memory cell can consistently change the logical state of the memory cell.

An embodiment of the invention includes a method of providing magnetic stability of a memory cell. The memory cell is generally located proximate to a conductive line, and proximate to a write mechanism that can set a magnetic state of the memory cell. The method includes receiving a representation of a maximum magnetic field intensity available from the write mechanism. A desirable placement of the memory cell relative to the conductive line can be generated, for providing stability of the memory cell, while still allowing the write mechanism to change the magnetic state of the memory cell.

Other aspects and advantages of the present invention will become apparent from the following detailed description, taken in conjunction with the accompanying drawings, illustrating by way of example the principles of the invention.

DETAILED DESCRIPTION

Figure 1:
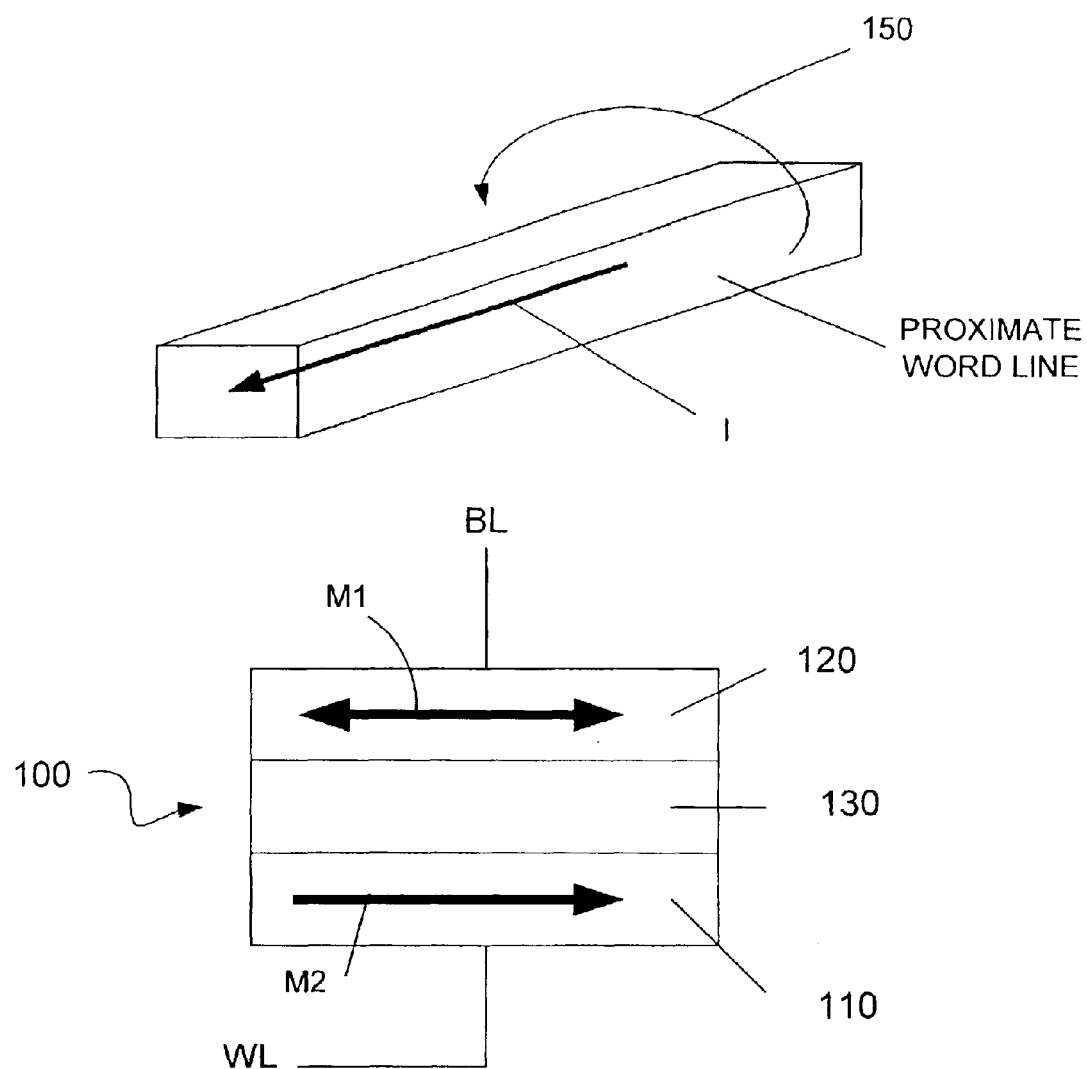
FIG. 1 shows a prior art MRAM memory cell.
Figure 2:
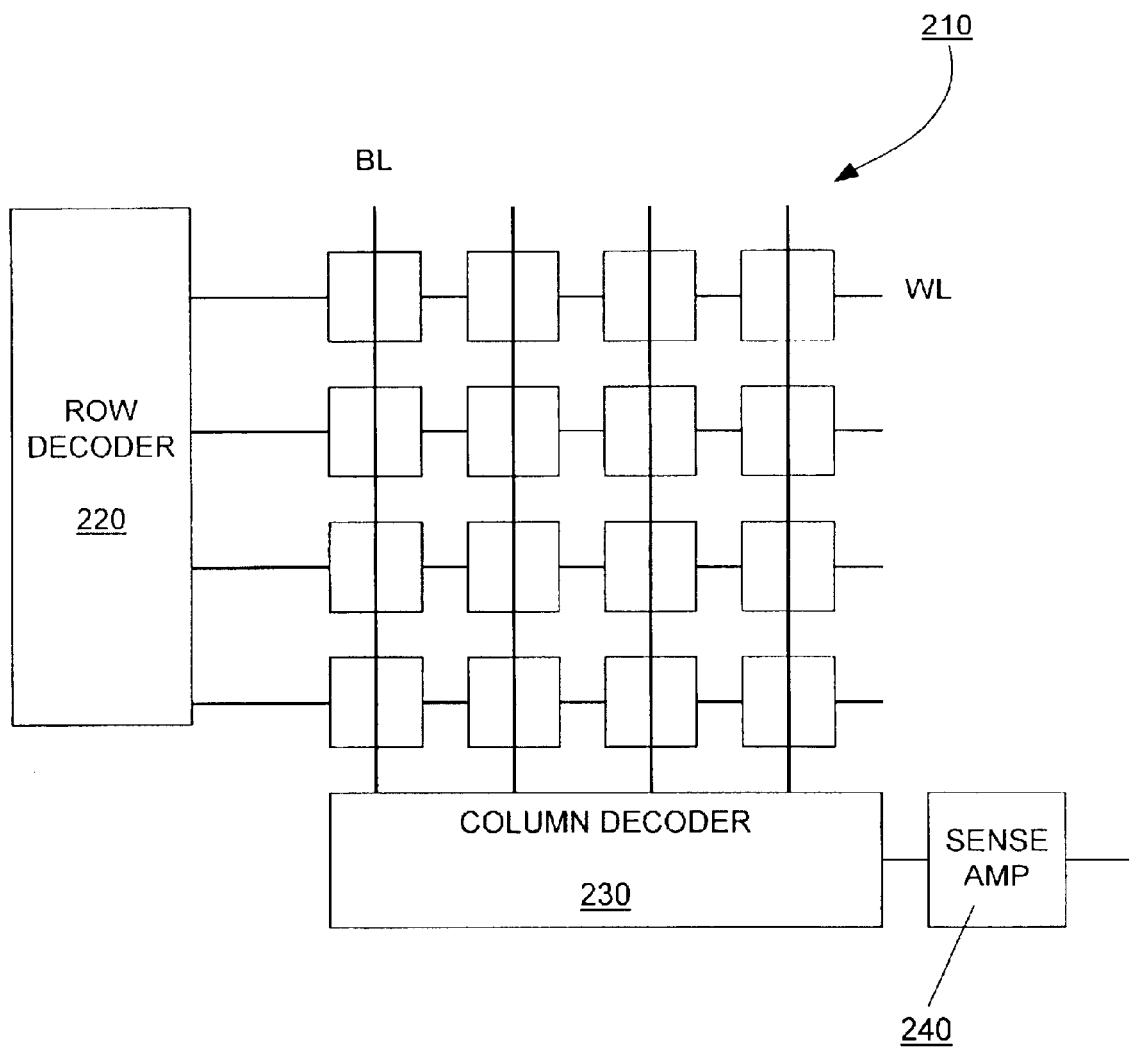
FIG. 2 shows an array of MRAM memory cells.

As shown in the drawings for purposes of illustration, the invention is embodied in an apparatus and method for providing magnetic stability of a memory cell, the memory cell being located proximate to a write line that can set a magnetic state of the memory cell.

Figure 3:
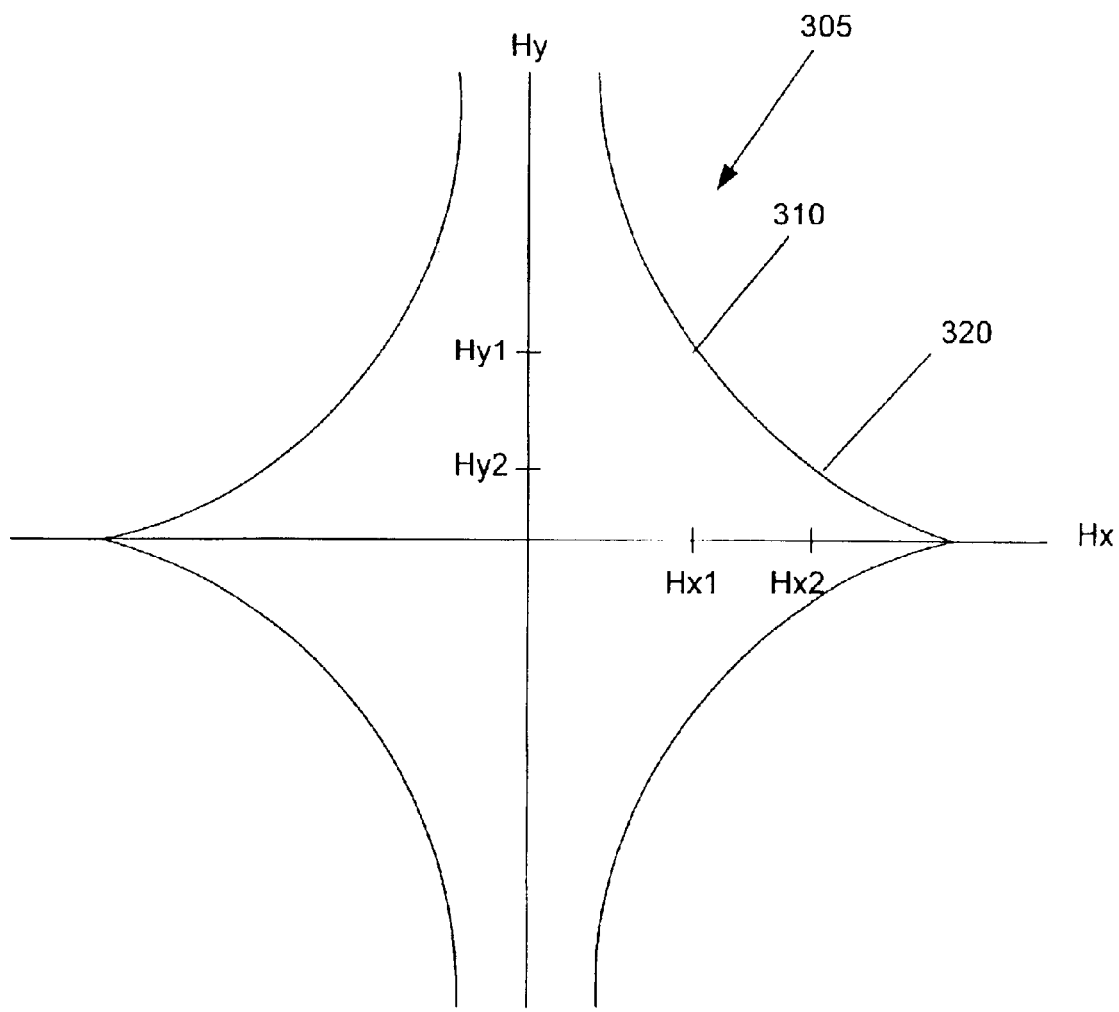
FIG. 3 is a plot that shows an intensity of externally applied magnetic fields required to cause a particularly shaped MRAM memory cell to change states.

FIG. 3 is a plot that shows an intensity of externally applied magnetic fields required to cause a particularly shaped MRAM memory cell to change states. A first axis is an Hx axis and a second axis is an Hy axis. A magnetic memory cell can generally be physically represented by an X-axis and a Y-axis. As will be discussed later, generally, the X-axis of the described MRAM memory cells corresponds with the longest cross-sectional dimension of the MRAM memory cells. Generally, the longest cross-sectional dimension of the MRAM memory cells corresponds with the most stable magnetic orientation of the MRAM memory cells. Therefore, the X-axis of the MRAM memory cells is generally the most stable magnetic orientation of the MRAM memory cells. As a result, two stable magnetic orientations of the MRAM cells generally includes two magnetic orientations as defined by the X-axis of the memory cells.

FIG. 3 shows the magnetic field intensity required to "flip" or change the magnetic orientation of the magnetic memory cell. For example, a first quadrant 305 of the plot of FIG. 3 shows the required Hy magnetic field to cause the MRAM memory cell to change magnetic states for various values of applied Hx magnetic field. A first switch point 310 suggests a first level Hx1 of required Hx magnetic field intensity to change the magnetic state of the memory cell for a first level Hy1 of Hy magnetic filed intensity. A second switch point 320 suggests a second level Hx2 of required Hx magnetic field intensity to change the magnetic state of the memory cell for a second level Hy2 of Hy magnetic filed intensity. The required Hx2 magnetic field intensity of the second switch point 320 is greater than the required Hy1 magnetic field intensity of the first switch point 310.

Generally, the more stable the MRAM memory cell, the greater the magnetic field intensity required to cause the MRAM memory cell to change states. The MRAM memory cell corresponding to FIG. 3 is more stable when an Hy field of intensity Hy2 is applied because a greater Hx magnetic field intensity is required to cause the MRAM memory cell to change states.

The shape of the magnetic field intensity switching curves shown in FIG. 3, generally correspond to a memory cell shape that is elliptical. Other memory cell shapes and the magnetic stability of each will be described.

Figure 4:
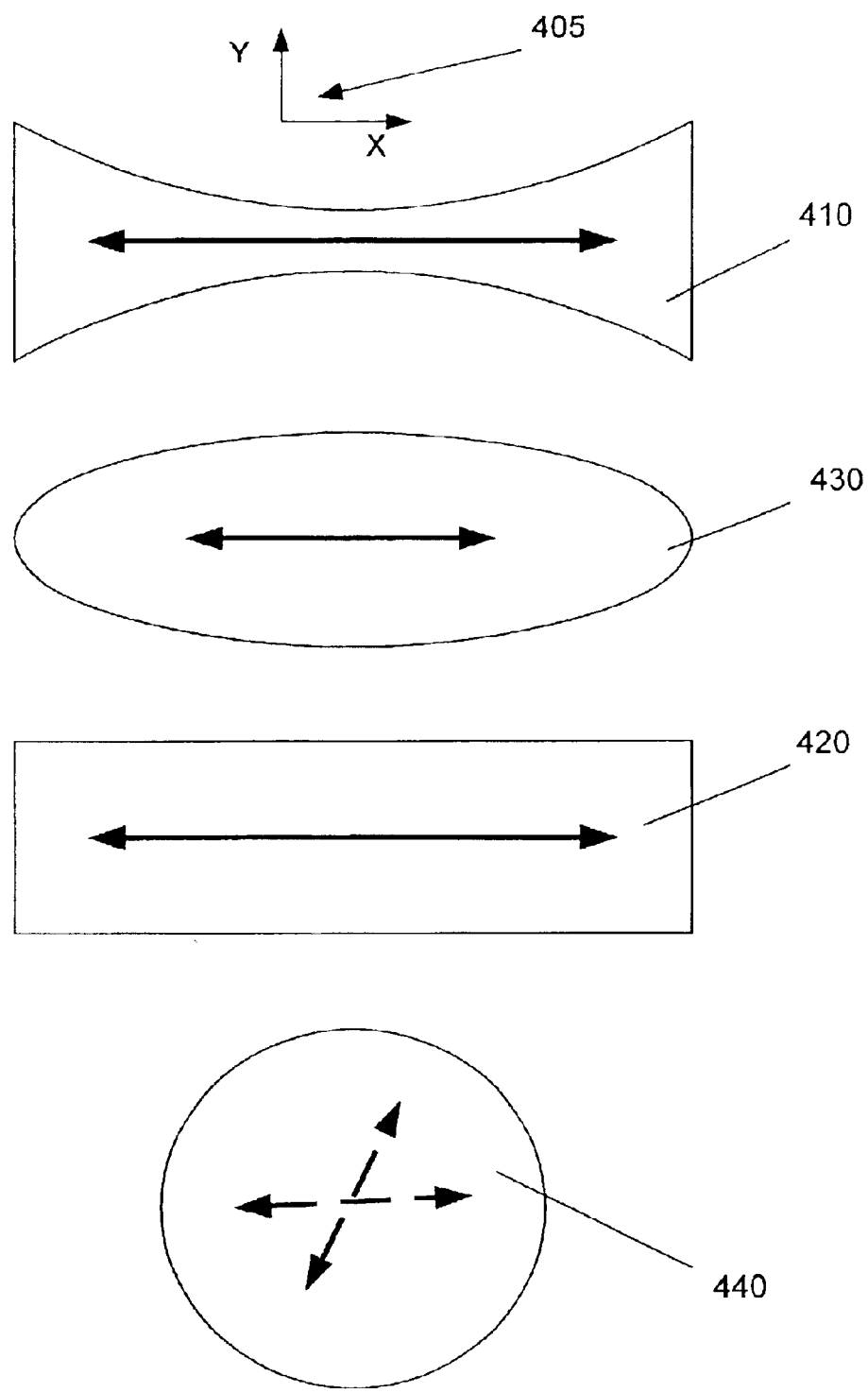
FIG. 4 shows possible shapes of memory cells having various levels of magnetic stability.

FIG. 4 shows possible shapes of memory cells having various levels of magnetic stability. An orientation indicator 405 depicts relative X-axis and Y-axis orientations of the various memory cell shapes. Generally, the X-axis corresponds to the longest cross-sectional dimension of the memory cells. The X-axis for each of the memory cells generally corresponds to the most stable magnetic orientation of the memory cells.

A first memory cell shape 410 includes a majority amount of the memory cell existing at each end of the memory cell 410. The X-axis dimension of the memory cell is substantially greater than the Y-axis dimension of the memory cell. Of the memory cell shapes shown in FIG. 4, the memory cell shape 410 is typically the most stable.

A second memory cell shape 420 includes an elliptical shape. As with the first memory cell shape 410, the X-axis dimension of this memory cell is substantially greater than the Y-axis dimension. The second memory cell shape 420 includes less memory material at each end than the first memory cell shape 410. The second memory cell shape 420, is generally considered to be very stable, but less stable than the first memory cell shape 410

A third memory cell shape 430 includes a rectangular shape. As with the first memory cell shape 410, the X-axis dimension of this memory cell is substantially greater than the Y-axis dimension. The third memory cell shape 430 includes less memory material at each end than the first memory cell shape 410. The third memory cell shape 430, is generally considered to be very stable, but less stable than the first memory cell shape 410, or the second memory cell shape 420.

A fourth memory cell shape 440 includes a circular shape. Unlike with the other memory cell shapes 410, 420, 430, the Y-axis dimension of this memory cell is substantially the same as the X-axis dimension. The magnetic orientation of the fourth memory cell shape is very unstable. This memory cell shape is undesirable because the memory cell will change magnetic orientations very easily.

As was previously mentioned, ability to repeatably manufacture the memory cells is very important As described, the shape of the memory cells influences the magnetic stability of the memory cells. Within an array of memory cells, it is desirable that the magnetic switching characteristics of each memory cell be approximately the same. This is desirable because the memory cells should be configured to be as stable as possible while still allowing the maximum magnetic field intensity available to flip the magnetic state of the memory cells. The maximum available magnetic field intensity should be able to switch every memory cell state, while the memory cells are each configured to be as stable as possible. The second memory cell shape 420 is generally easier to repeatably manufacture than the first memory cell shape 410 or the third memory cell shape 430. Therefore, in certain situations, the second memory cell shape 420 may be the preferred due to consistency of operation.

Figure 5:
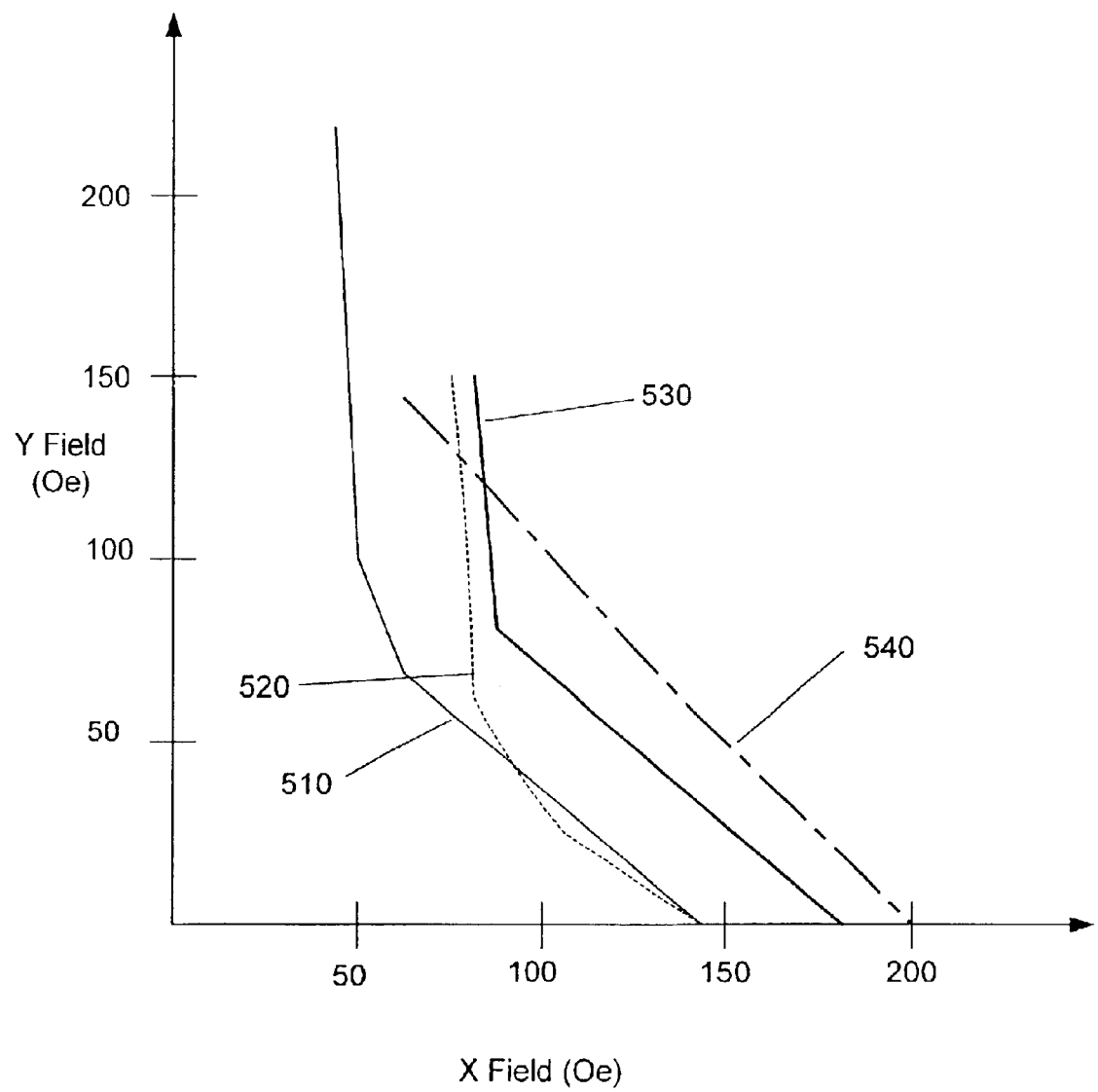
FIG. 5 is a plot showing the intensity of externally applied magnetic fields required to cause the MRAM memory cells having the shapes of FIG. 4 to change states.

FIG. 5 is a plot showing the intensity of externally applied magnetic fields required to cause the MRAM memory cells to change shapes, for various memory cell shapes.

A first curve 510 represents the magnetic switching curve for an ellipse shaped memory cell having a Y-axis dimension of 0.18 um and an X-axis dimension of 0.36 um. A second curve 520 represents the magnetic switching curve for an ellipse shaped memory cell having a Y-axis dimension of 0.18 um and an X-axis dimension of 0.27 um. A third curve 530 represents the magnetic switching curve for a rectangular shaped memory cell having a Y-axis dimension of 0.18 um and an X-axis dimension of 0.36 um. A fourth curve 540 represents the magnetic switching curve for a rectangular shaped memory cell having a Y-axis dimension of 0.18 um and an X-axis dimension of 0.27 um.

The magnetic field intensity required to cause the magnetic memory cell to switch states can be determined by computer aided simulation, and the Landau-Lifschitz equation. More precisely, solving:

$$\frac{d\overline{M}(r)}{dt} = -\gamma \overline{M}(r) \times \overline{Heff} - \frac{\lambda}{|M|} \overline{M} \times (\overline{M}(r) \times \overline{Heff}(r))$$

Where M is a magnetization vector, Heff is an effective magnetic field which includes anisotropy terms and noise terms, t is time, r represents three dimensional spatial coordinates, $\lambda$ is a damping parameter and $\gamma$ is a gyromagnetic constant.

The responses of the magnetic memory cell to different write currents and operating conditions are obtained by computer simulation in which the Landau-Lifschitz equation is solved with discretized 3-dimensional geometry, using iterative methods. The exact geometry of the sense layer, the reference layer, the cladding and the conductor, as well as material properties (for example, crystalline anisotropy, saturation magnetization and exchange constant) and thermal noise are included.

The simulation conditions of FIG. 5 included the sense layer being formed from NiFe, the conductor being formed from copper, and the cladding being formed from NiFe. The spacing between the memory cells and the conductor was assumed to be 0.1 um. The reference layer was assumed to be an IrMn pinned NiFe layer.

These plots clearly show that increasing the X-axis dimension of the memory cell shape increases the magnetic stability of the memory cells. Additionally, these plots show that with lower levels of Hx, the elliptical shaped memory cell having the X-axis dimension of 0.36 um is generally the most stable shape.

Computer simulation can provide an optimal memory cell shape by determining the memory cell shape that provides the maximal stability, while still ensuring the memory cell can change states when the maximal available magnetic write field intensity to applied to the memory cell.

Figure 6:
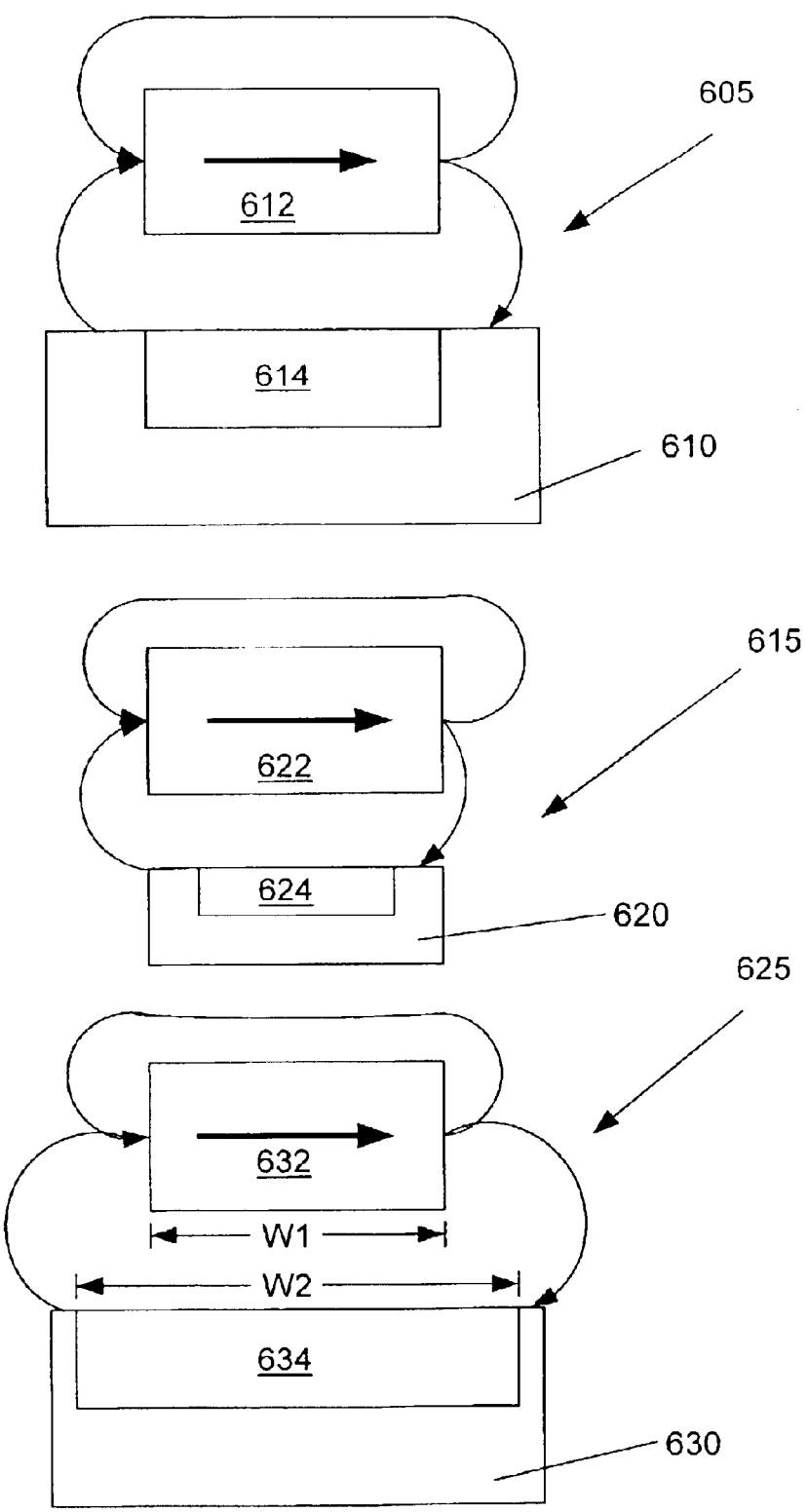
FIG. 6 shows memory cells located proximate to various shapes of u-shaped conductive lines.

FIG. 6 shows memory cells 612, 622, 632 located proximate to various shapes of conductive lines 614, 624, 634. The conductive lines 614, 624, 634 of FIG. 6 each include a u-shaped cladding 610, 620, 630 that interact with the memory cells 612, 622, 632. The various shapes of the conductive lines 614, 624, 634 provide different degrees of overlap of the memory cells 612, 622, 632 with the u-shaped openings of the cells 612, 622, 632.

The u-shaped designation is used loosely. That is, the conductive lines that include cladding on all sides except a side facing, or closest to the memory cells 612, 622, 632. The conductive lines 614, 624, 634 are actually rectangular shaped.

The different degrees of overlap provide varying levels of coupling between the memory cells 612, 622, 632 and the u-shaped cladding 610, 620, 630. The overlap defines how large the width W1 of the memory cell is with respect to the width W2 of the conductor line. The amount of overlap can be used to provide additional control over the stability of the memory cells 612, 622, 632.

The cladding 610, 620, 630 is typically a ferromagnetic material, that can be NiFe. The conductive lines 614, 624, 634 can generate a write magnetic field in response to an externally supplied write current that is conducted through the conductive lines 614, 624, 634. The write magnetic field is substantially contained within the ferromagnetic cladding. Essentially, the ferromagnetic cladding provides a closed magnetic path (flux closure) around the conductive lines 614, 624, 634. By passing a write current of a predetermined magnitude and direction through the conductors, a resulting write magnetic field that is strong enough to establish an orientation of magnetization in a known direction in a soft ferromagnetic sense layer of the memory cell is created. The ferromagnetic cladding substantially attenuates fringe fields that can interfere with or corrupt data stored in the ferromagnetic data layers of neighboring memory cells. The ferromagnetic cladding typically includes a tailored thickness that is designed to insure that the magnetic write field is substantially contained within the cladding.

The cladding provides two functions. First, the cladding provides concentration of the magnetic write field produced by the write current conducted through the conductive lines. Therefore, the magnitude of the current required to alter the magnetic orientation of the memory cells is less than it would be if the cladding was not present. Second, the cladding provides additional stability of the memory cells. That is, the presence of the cladding reduces that possibility that memory cells proximate to the cladding will change states unexpectedly.

For the embodiments of the conductive lines of FIG. 6, the shapes of the cladding 610, 620, 630 can be characterized by a ratio (W2/W1) of the size of the opening of the cladding (designated as W2 in FIG. 6) to the X-axis of the memory cells (designated as W1 in FIG. 6). A first embodiment 605 includes W2 being substantially equal to W1. A second embodiment 615 includes W2 being less than W1. A third embodiment 625 includes W2 being greater than W1.

Figure 7:
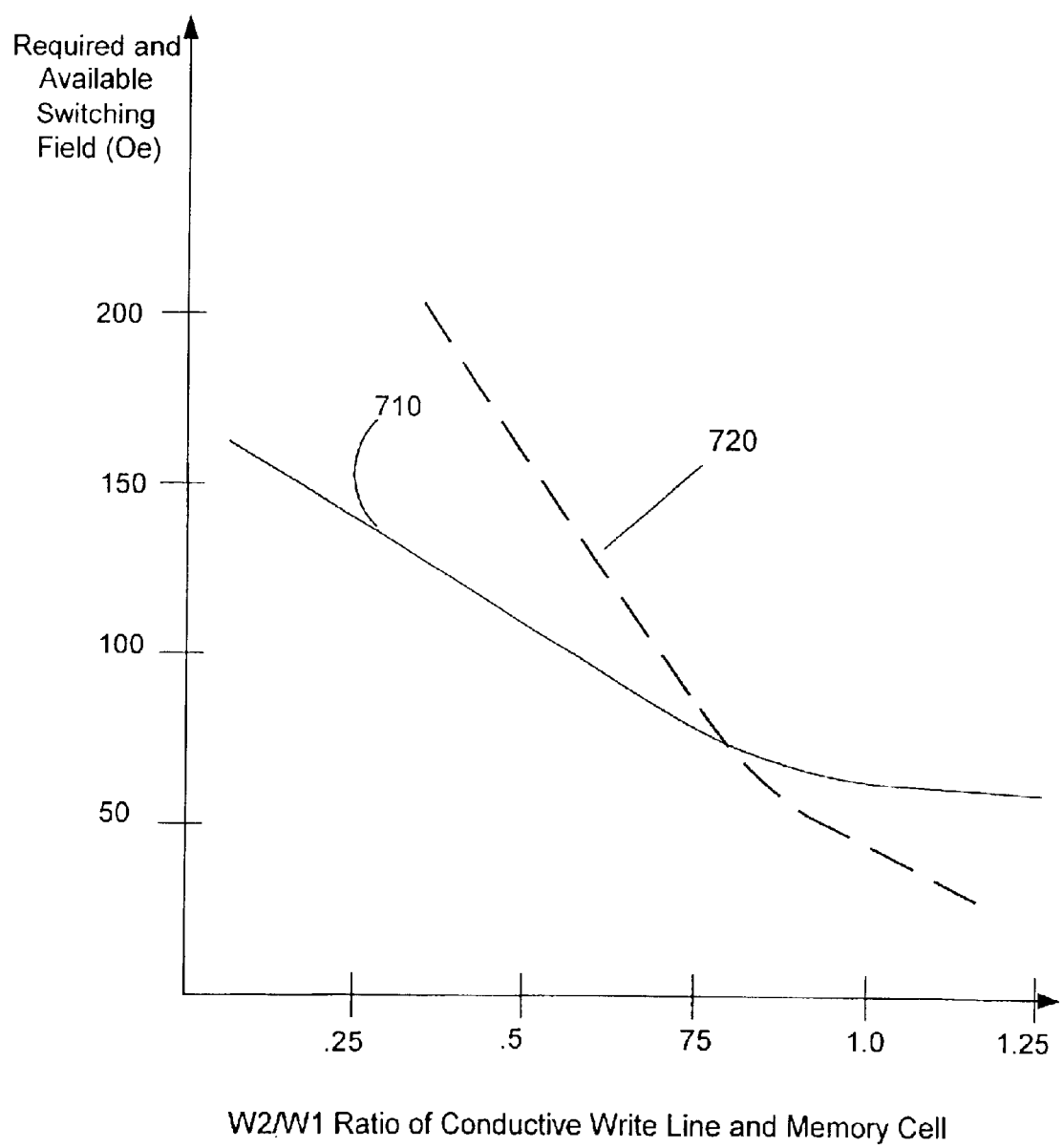
FIG. 7 is a plot showing the intensity of externally applied magnetic fields required to cause the MRAM memory cells located proximate to the conductive lines of FIG. 6 to change states.

FIG. 7 is a plot showing the intensity of externally applied magnetic fields required to cause the MRAM memory cells located proximate to the conductive lines and include varying degrees of overlap with the conductive lines. The plot shows the variations of the magnetic field required to cause the memory cell to switch states for various ratios of W2/W1.

A first curve 710 depicts the magnetic field produced by the conductive line, and a second curve 720 depicts the magnetic field required to cause the memory cell to change magnetic states. An optimal W2/W1 ratio is about 0.75 to 1.0. At this ratio, the two curves 710, 720 are roughly equal. However, more importantly, the magnetic field produced 710 is greater than the magnetic field 720 required to cause the memory cell to change magnetic states. The optimal ratio can change if the physical characteristics of the conductive line and the memory cell are varied.

Again, the magnetic field intensity required to cause the magnetic memory cell to switch states in FIG. 7 can be determined by computer aided simulation, and the above described Landau-Lifschitz equation.

It is to be understood that memory cell overlap and memory cell shape, are very interdependent. For example, square memory cells with a large amount of overlap between the memory cells and cladding are very stable. The increased overlap provides effectively the same result as increasing the aspect ratio of a rectangular memory cell. Essentially, the greater surface area of the memory cell overlap, the greater the stability of the memory cell.

Figure 8:
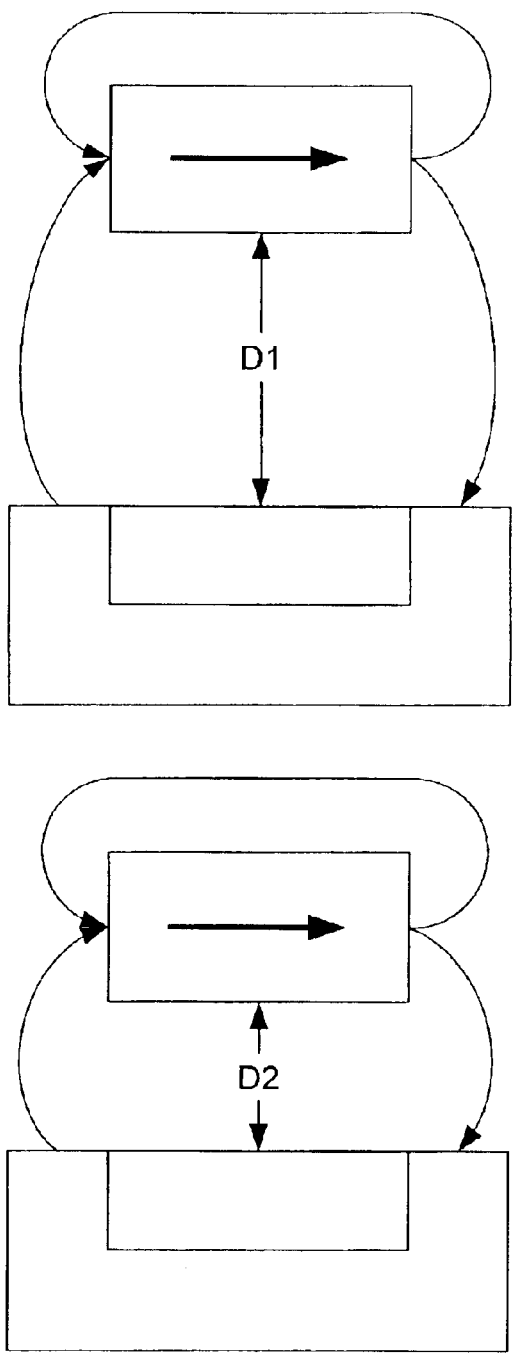
FIG. 8 shows memory cells located various distances from a u-shaped conductive line.

FIG. 8 shows memory cells located various distances from a u-shaped conductive line. A first memory cell 810 is located a first distance D1 from a first write line 812 that include cladding 814. A second memory cell 820 is located a second distance D2 from a second write line 822 that include cladding 824.

Generally, the closer an MRAM memory cell is to a cladded write line, the greater the coupling between the memory cell and the write line. Therefore, controlling the distance between the memory cell and the cladded write line can also be used to control the stability of the memory cell. In FIG. 8, D1 is greater than D2. Therefore, the first memory cell 810 of is generally less stable than the second memory cell 820.

Figure 9:
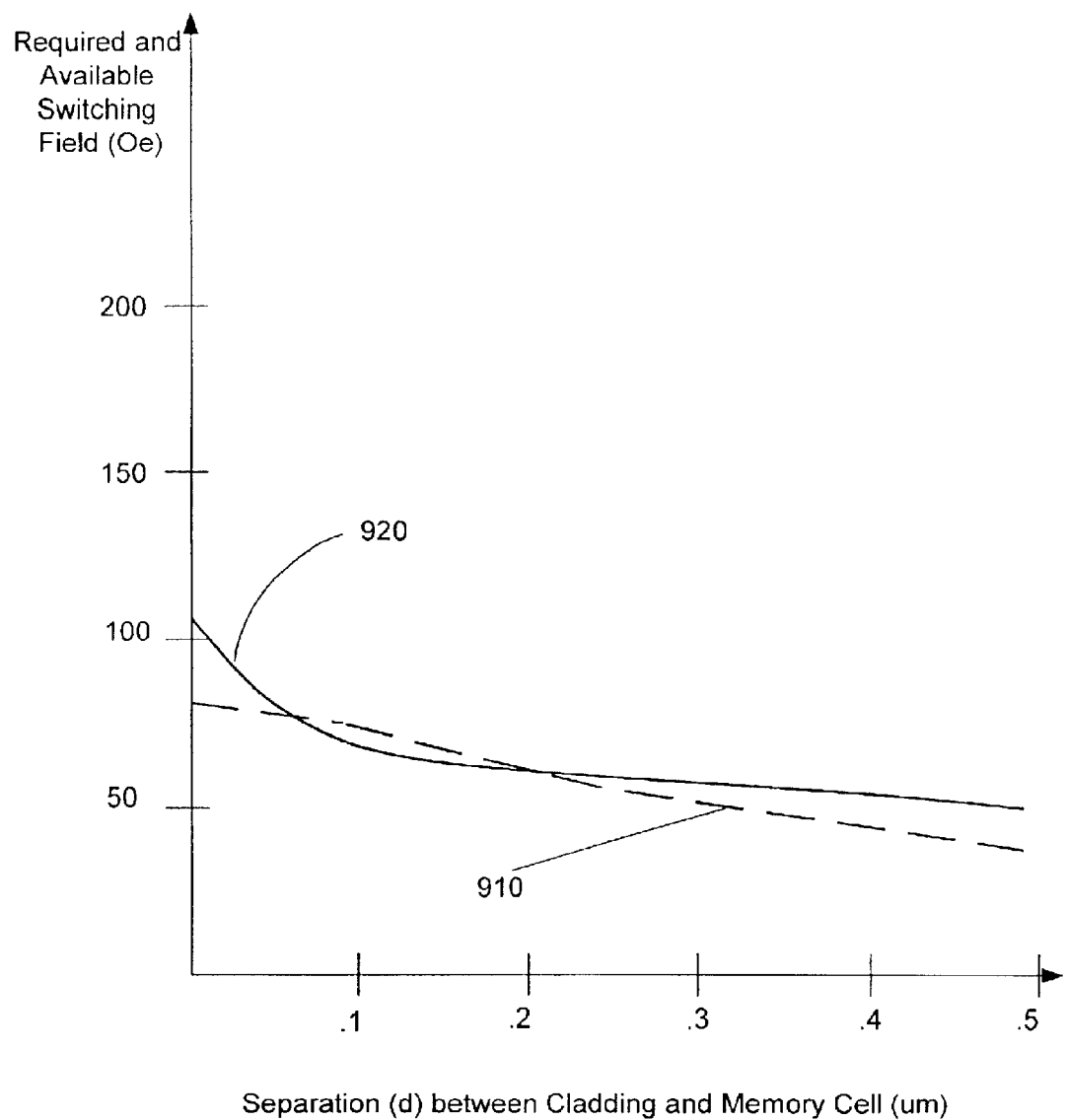
FIG. 9 is a plot showing the intensity of externally applied magnetic fields required to cause the MRAM memory cells located various distances from the conductive lines of FIG. 8 to change states.

FIG. 9 is a plot showing the intensity of externally applied magnetic fields required to cause the MRAM memory cells located various distances from the conductive lines of FIG. 8 to change states.

Again, the magnetic field intensity required to cause the magnetic memory cell to switch states in FIG. 8 can be determined by computer aided simulation, and the above described Landau-Lifschitz equation.

As the distance between the memory cell and a cladded write line decreases, the coupling between ferromagnetic cladding of the write line and data film of the memory cell increases. When the distance is zero (that is, the memory cell and the write line physically touch each other), the coupling between the memory cell and the write line is the greatest. The coupling is due to exchange interaction between the memory cell and the write line, and due to magnetostatic interaction between the memory cell and the write line. Exchange interaction is caused due to short-range spin interaction between the memory cell and the write line that holds the neighboring spins together. Magnetostatic interaction or demagnetization interaction is an interaction that exists between magnetic bodies.

The coupling between the memory cell and the conductive write line effectively increases the aspect ratio (length/width) of the memory cell. That is, the memory cell tends to be more stable due to the coupling. If the coupling is too strong, the memory cell can become so stable that switching the magnetic state of the memory cell is not possible due to constraints on the magnetic field intensity available for changing the state of the memory cell.

If the distance between the memory cell and the conductive write line is greater than zero, then the exchange interaction between the memory cell and the cladding of the write line is eliminated, and all that is left is the magnetostatic interaction.

As the distance between the memory cell and the cladding of the conductive write line increases, the coupling between the memory cell and the cladding decreases. Therefore, the memory cell becomes less stable.

A first curve 910 depicts the magnetic field produced by the conductive line, and a second curve 920 depicts the magnetic field required to cause the memory cell to change magnetic states. An optimal distance for this embodiment can be a separation distance of 50 nm to 200 nm. Within this separation distance, the magnetic write field produces by the conductive line is approximately equal to the magnetic write field required to alter the state of the memory cell.

The memory cell shape, the amount of overlap and the distance between the memory cell and the write mechanism, can all be used to vary the practical trade off between memory cell stability and the ability to generate a magnetic write field.

Figure 10:
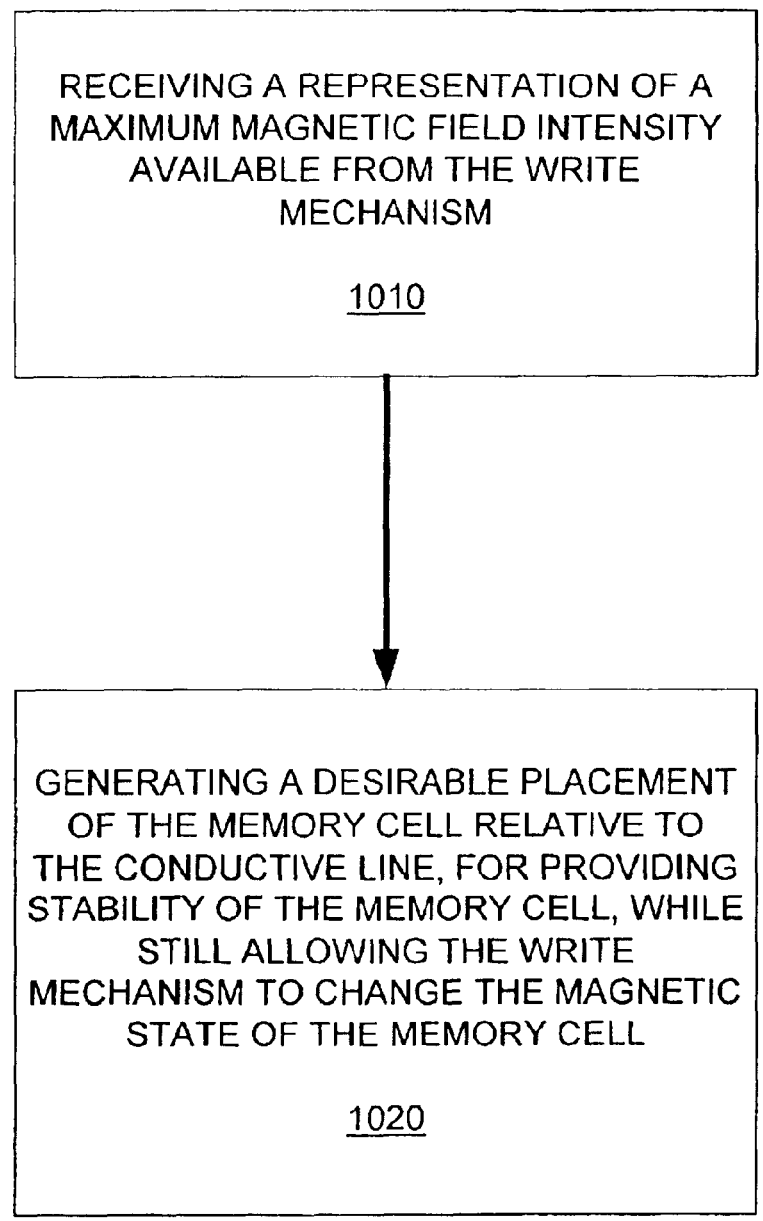
FIG. 10 is a flow chart showing a method of providing stability of a memory cell according to an embodiment of the invention.

FIG. 10 is a flow chart showing a method of providing stability of a memory cell according to an embodiment of the invention. This embodiment includes a method of providing magnetic stability of a memory cell. The memory cell can be located proximate to a write line that can set a magnetic state of the memory cell.

A first step 1010 includes receiving a representation of a maximum magnetic field intensity available from the write mechanism. The maximum magnetic field intensity available can be limited due to limitation on the amount of current that can flow through the bit lines and word lines. Current conducted through the word lines and the bit lines can be limited by heat produced by the word lines and bit lines. Additionally, the current can be limited by electromigration. The representation can come in many different forms. For example, the write mechanism can be a conductive line. Manufacturing of the conductive line may require that conductive line be of a preferred size. The size of the conductive line can limit the amount of current that is conducted by the conductive line, and therefore, the maximum available magnetic field intensity. The current conducted by the conductive line can be limited by the amount of power that can be dissipated by the conductive line.

A second step 1020 includes generating a desirable placement of the memory cell relative to the conductive line, for providing stability of the memory cell, while still allowing the write mechanism to change the magnetic state of the memory cell.

Generating a desirable placement of the memory cell relative to the write line can include determining a desirable distance between the memory cell and the conductive line. Additionally, generating a desirable placement of the memory cell relative to the conductive line can include determining an desirable overlap between the memory cell and the write line.

The method of providing magnetic stability of a memory cell can further include determining a desirable shape of the memory cell. A desirable shape can be influenced by the stability provided by the shape, and by how repeatably the shape can be manufactured.

The write mechanism, generally includes a pair of write lines. The write lines can be cladded on all but one side. Generally, the non-cladded side is oriented in the direction of the memory cell. Desirable magnetic cladding material can include NiFe. Generally, the magnetic cladding can include a soft ferromagnetic material.

The cladded conductive lines can be formed in a substrate. A dielectric can be formed within a trench formed in the substrate. The dielectric can be planarized by a chemical mechanical process. A trench can be formed in the dielectric prior to depositing a high magnetic permeability soft magnetic material that will form a portion of the cladding. A portion of the cladding can be deposited using an isotropic process so that the side walls of the trench are coated to roughly the same thickness as a bottom of the trench. The material used for cladding is a magnetically soft material. That is, it is permeable enough to act as a magnetic core an is continuous throughout its cross-section without any breaks or to many voids. Another trench is formed as a result of the isotropic deposition of the cladding. The trench is filled with an electrically conductive material such as copper using electroplating or other suitable deposition process to from the conductive line. The entire structure can be planarized using a chemical-mechanical polishing process.

Although specific embodiments of the invention have been described and illustrated, the invention is not to be limited to the specific forms or arrangements of parts so described and illustrated. The invention is limited only by the appended claims.

What is claimed:

1. A method of providing magnetic stability of a memory cell, the memory cell being located proximate to a first conductive line, and proximate to a second conductive line that can set a magnetic state of the memory cell, the method comprising:

receiving a representation of a maximum magnetic field intensity available from the second conductive line;

generating a desirable placement of the memory cell relative to the first conductive line, for providing stability of the memory cell, while still allowing the second conductive line to change the magnetic state of the memory cell.

2. The method of providing magnetic stability of a memory cell of claim 1, wherein the second conductive line is a write line.

3. The method of providing magnetic stability of a memory cell of claim 2, wherein the write line is cladded.

4. The method of providing magnetic stability of a memory cell of claim 3, wherein the cladded write line is u-shaped.

5. The method of providing magnetic stability of a memory cell of claim 3, wherein the write line is cladded on all side except for a non-cladded side, and the non-cladded side is oriented in a direction of the memory cell.

6. The method of providing magnetic stability of a memory cell of claim 1, wherein the first conductive line is a write line.

7. The method of providing magnetic stability of a memory cell of claim 1, wherein the first conductive line is not a write line.

8. The method of providing magnetic stability of a memory cell of claim 2, wherein generating a desirable placement of the memory cell relative to the first conductive line comprises:

determining a desirable distance between the memory cell and the first conductive line.

9. The method of providing magnetic stability of a memory cell of claim 2, wherein generating a desirable placement of the memory cell relative to the first conductive line comprises:

determining a desirable overlap between the memory cell and the first conductive line.

10. The method of providing magnetic stability of a memory cell of claim 1, further comprising:

determining a desirable shape of the memory cell.

11. The method of providing magnetic stability of a memory cell of claim 10, wherein the desirable shape of the memory cell is at least partially dependent upon an ability to consistently, repeatably manufacture the desirable shape of the memory cell.

12. The method of providing magnetic stability of a memory cell of claim 1, further comprising:

determining desirable magnetic stability of a plurality of memory cells;

determining a desirable shape of the memory cells.

13. The method of providing magnetic stability of a memory cell of claim 1, further comprising:

selecting a desirable cladding material for the first conductive line.

14. The method of providing magnetic stability of a memory cell of claim 13, wherein the desirable cladding material comprises a soft ferromagnetic material.

15. The method of providing magnetic stability of a memory cell of claim 1, wherein the memory cell is an MRAM memory cell.

16. An apparatus for providing magnetic stability of a memory cell, the memory cell being located proximate to a first conductive line, and proximate to a second conductive line that can set a magnetic state of the memory cell, the apparatus comprising:

means for receiving a representation of a maximum magnetic field intensity available from the second conductive line;

means for generating a desirable placement of the memory cell relative to the first conductive line, for providing stability of the memory cell, while still allowing the second conductive line to change the magnetic state of the memory cell.

17. The apparatus of providing magnetic stability of a memory cell of claim 16, wherein generating a desirable placement of the memory cell relative to the first conductive line comprises:

determining a desirable distance between the memory cell and the first conductive line.

18. The apparatus of providing magnetic stability of a memory cell of claim 16, wherein generating a desirable placement of the memory cell relative to the first conductive line comprises:

determining a desirable overlap between the memory cell and the first conductive line.

19. The apparatus of providing magnetic stability of a memory cell of claim 16, further comprising: determining a desirable shape of the memory cell.

20. A computer program product for providing magnetic stability of a memory cell, the computer program product comprising a computer usable medium having readable program means for causing a computer to perform the acts of:

receiving a representation of a maximum magnetic field intensity available from a second conductive line;

generating a desirable placement of the memory cell relative to a first conductive line, for providing stability of the memory cell, while still allowing the second conductive line to change the magnetic state of the memory cell.

* * * * *